United States Patent
Smith (10) Patent No.: US 8,565,844 B2
(45) Date of Patent: *Oct. 22, 2013

(54) NUMBER RESOLVING SUPERCONDUCTING NANOWIRE PHOTON DETECTOR VIA A MULTI-LAYER HARDWARE ARCHITECTURE

(75) Inventor: Amos Matthew Smith, Rome, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 87 days.

This patent is subject to a terminal disclaimer.

(21) Appl. No.: 13/506,857

(22) Filed: Apr. 17, 2012

(65) Prior Publication Data

US 2013/0150245 A1 Jun. 13, 2013

Related U.S. Application Data

(60) Provisional application No. 61/631,442, filed on Dec. 13, 2011.

(51) Int. Cl.
*G01F 23/24* (2006.01)

(52) U.S. Cl.
USPC .......................................................... 505/160

(58) Field of Classification Search
USPC .................... 505/160; 250/214 R; 977/954
See application file for complete search history.

(56) References Cited

U.S. PATENT DOCUMENTS

| | | | |
|---|---|---|---|
| 2009/0050790 A1* | 2/2009 | Dauler et al. | 250/214 R |
| 2010/0123120 A1* | 5/2010 | Mohseni | 257/21 |
| 2013/0172195 A1* | 7/2013 | Bellei et al. | 505/160 |
| 2013/0187051 A1* | 7/2013 | McCaughan et al. | 250/340 |

* cited by examiner

*Primary Examiner* — Colleen Dunn
(74) *Attorney, Agent, or Firm* — Joseph A. Mancini (57) ABSTRACT

A superconducting nanowire photon detector apparatus comprising detection, insulating, and substrate layers. The insulating layer provides electrical isolation of a plurality of individual detector elements from the interconnection network fabricated on the substrate layer except where electrical interconnection between the inputs and outputs of each detector element and the interconnection network is intended.

13 Claims, 8 Drawing Sheets

NUMBER RESOLVING SUPERCONDUCTING NANOWIRE PHOTON DETECTOR VIA A MULTI-LAYER HARDWARE ARCHITECTURE

PRIORITY CLAIM UNDER 35 U.S.C. §119(e)

This patent application claims the priority benefit of the filing date of provisional application Ser. No. 61/631,442, having been filed in the United States Patent and Trademark Office on Dec. 13, 2011 and now incorporated by reference herein.

STATEMENT OF GOVERNMENT INTEREST

The invention described herein may be manufactured and used by or for the Government for governmental purposes without the payment of any royalty thereon.

BACKGROUND OF THE INVENTION

The ability of a, very thin and very narrow, section or "nanowire" of superconducting material to detect the impact of a photon has long been known. The basic principle is as follows. A nanowire of a superconducting material is created and electrical wired to a voltage source. As the current flows thought the wire it creates heat. If the cooling needed to reach the temperature for superconducting phenomena ($T_C$ of approximately 10 kelvin or less) and the heating due to the current density in the nanowire are properly balanced, then the nanowire can be held extremely close to, but under, the superconducting phase transition. Below this critical temperature, $T_C$, the wire effectively has no resistance. Just above the critical temperature the wire is not superconducting and has a finite resistance. When a photon strikes the superconducting nanowire it breaks the Cooper pairs in the vicinity and creates a hot spot. If this photon induced hotspot raises the temperature of the segment of nanowire above $T_C$ then the hotspot will undergo a phase transition and no longer be superconducting. If the non-superconducting area is large enough, or equivalently the nanowire is small enough, it will block the entire nanowire. This leads to a sudden rise in the resistance of the nanowire. This change in resistance can be detected by various electronic setups and a single photon is counted. Once the hot spot from the incident photon disperses, the wire will return to the superconducting state and the device will be ready to detect another photon. This is called the reset time of the device.

Traditional Superconducting Nanowire Single Photon Detectors (SNSPD) are made from one long nanowire. In order for this single nanowire to cover a useful area a "meander" is created. In effect the wire is folded back and forth across the desired area, usually about 10 μm by 10 μm (microns). These devices are called "single photon detectors" because the nanowire can only feel the loss of the superconducting condition somewhere along its length. If two photons hit the nanowire at the same time, two hot spots are created but only the increase in resistance is felt so the detector can "see" only one photon. Such detectors are effectively high pass filters; they can detect the presence of 1 or more photons without being able to count them. Similarly the device has no means of measuring spatial resolution. The output signal of the device does not and cannot be made to be a function of the location of the photon impact.

A second drawback of the long nanowire approach is the relaxation time of the detector. It has been shown that the relaxation time, the time for a hot spot to dissipate, is related to the kinetic-inductance and thus the length of the nanowire. This leads to a relaxation time of about 10 ns for the single wire 10 μm by 10 μm meander. The operational repetition rate will need to be significantly slower than the relaxation time of the device, to avoid interactions between the relaxation and incoming photons. This leads to experimental repetition rates much slower than current pulsed laser systems which are capable of GHz frequencies.

To create the number resolution of the overall optical device multiple nanowires detectors are needed. In U.S. Patent Application Publication No. 2009/0050790A1 by Dauler et al., one possible method to gain some amount of number resolution is given, the so called multi element superconducting nanowire single photon detector (MESNSPD). Their method involves interleaving multiple long nanowires in a parallel meander across the surface of a substrate chip. While this solution is somewhat effective in creating number resolution, it has numerous drawbacks common to all current SNSPDs and the limited number of nanowires available, currently 10 or so, limits the number resolution of the device.

One of the most important effects in a SNSPD is that of current crowding. Current crowding in superconducting nanowires has been studied by Clem and Berggren. The heating in the superconducting nanowire, as mentioned above, is vital and is determined by the local current density along the wire. Ergo an area with higher current density will be "hotter" than an area of low current density. In order to maintain the necessary superconducting condition along the full length of the wire the maximum bias current applied through any nanowire detector is determined by the point of highest current density and therefore highest temperature. Current crowding as discussed by Clem and Breggen describes the effect of bends and constrictions in the nanowire which increase the local current density, such as the bends in the multi element superconducting nanowire single photon detector (MESNSPD) of Dauler et al. and standard SNSPDs. These bends'are then the hottest spots on the detector, i.e. the closest to the critical temperature $T_C$. This is a significant problem as the quantum efficiency of any region of a nanowire is proportional to how close the nanowire region is to $T_C$. The incident single photon carries a very small amount of energy and creates a small amount of heating. The closer the operating temperature, sometimes called bias temperature $T_B$, is to the $T_C$ the higher the efficiency of that region of nanowire is. The quantum efficiency of the devise can then be thought of as the average efficiency of all the segments of the wire. If one segment is higher in temperature, such as the bends in a current SNSPD or MESNSPD, then ALL of the rest of the wire will have a lower efficiency. We also note that the high efficiency corners are often left out of what is considered the "active" area of many devices.

It should also be noted that in all current SNSPDs or MESNSPDs the current crowding effect limits the fill factor. Fill factor is the ratio of the active area that can detect a photon to that which can't, i.e. the ratio of the nanowire area to substrate area within the active detection area. Yang et al. teach in their article "Suppressed Critical Currents in Superconducting Nanowire Single-Photon Detectors with High Fill-Factors" that, as the name implies, large fill factor detectors have lower efficiency. This is a counterintuitive result as one would expect that the more photon sensitive area there was within the active area the higher the efficiency would be. In the work of Clem and Breggen it is noted that the sharper the bend in a nanowire the worse the effect of current crowding becomes. As the fill factors increase in all single layer SNSPDs and MESNSPDs the bends approach the worst case of sudden 180 degree turns. This limits the fill factor of any traditional detector and thus reduces the total quantum efficiency.

Another drawback of SNSPDs that likewise persists in MESNSPDs are long reset times. The reset time of a SNSPD is directly proportional to the kinetic inductance of the nanowire and can be altered by altering the geometry of the nanowire, such as its thickness or width. For a given geometry, the kinetic inductance is directly proportional to the length of the nanowire. Thus the reset time can be adjusted by changing the length of the superconducting nanowire, i.e. shortening the wire will provide the benefit of a shorter reset time. This is a significant drawback to existing SNSPND and MESNSPD. Because they are based on long continuous wires the effect of reducing the length of the wire is to reduce the size of the active area of the detector. Such a reduction in area is often unacceptable as the input photons are difficult to focus on a small area. In the MESNSPD this can be countered to a degree by adding more wires into the meander pattern, thus spreading it back outward, but even here the nanowires remain tens of microns long.

One definition of an ideal number resolving photon counter would be an analog of modern CCD cameras. In that example, it is desired to have a large two dimensional array of pixels that covers the active area with the maximum number of small pixels, which are placed as compactly as physically possible. This would lead to being able to resolve large numbers of photons (from the large number of pixels), the shortest practical reset time, good spatial resolution (both from the small pixels), and the highest fill factor (from the closely packed pixels).

As a final comment that must be mentioned with regard to the prior art is the lack of spatial resolution. The SNSPDs and MESNSPD discussed above have little to no spatial resolution because each nanowire crosses the full, or at least a significant percent of in the case of non interleaved MESNSPD, active area of the device.

What is needed therefore and has to date not been provided by the prior art is a superconducting nanowire photon detector that allows for improvements across a wide area of device characteristics, such as a reset time, fill factor, high quantum efficiency, spatial resolution and most importantly highly efficiency resolution of the number of incident photons (number counting). This is needed as many experiments and applications in quantum optics require number resolution to be able to produce the correct results.

OBJECTS AND SUMMARY OF THE INVENTION

It is therefore desirable to develop a device that can overcome some or preferably all of the shortcomings of current devices, as listed above. The present invention is capable of improving performance in all of these areas.

Briefly stated, the present invention provides a superconducting nanowire photon detector apparatus comprising detection, insulating, and substrate layers. The insulating layer provides electrical isolation of a plurality of individual detector elements from the interconnection network fabricated on the substrate layer except where electrical interconnection between the inputs and outputs of each detector element and the interconnection network is intended.

In a preferred embodiment of the present invention, a superconducting nanowire photon detector apparatus comprises a substrate layer having an interconnection means fabricated thereon; an insulating layer; and a detection layer, where the detection layer comprising a plurality of detector elements being fabricated thereon, and each of the detector elements have an input and an output. In the preferred embodiment, the substrate comprises the bottom layer; the insulating layer comprises the middle layer; and the detection layer comprises the top layer. The insulating layer is fabricated between the said substrate layer and the detection layer so as to insulate the interconnection means from the detection layer. The interconnection means facilitates routing signals input into the apparatus to the inputs of each of the plurality of detector elements and routing signals output from each of said plurality of detector elements out of the apparatus. The insulating layer has means for each of the inputs and outputs of each of the detector elements to make electrical contact with corresponding portions of the interconnection means.

Figure 1:
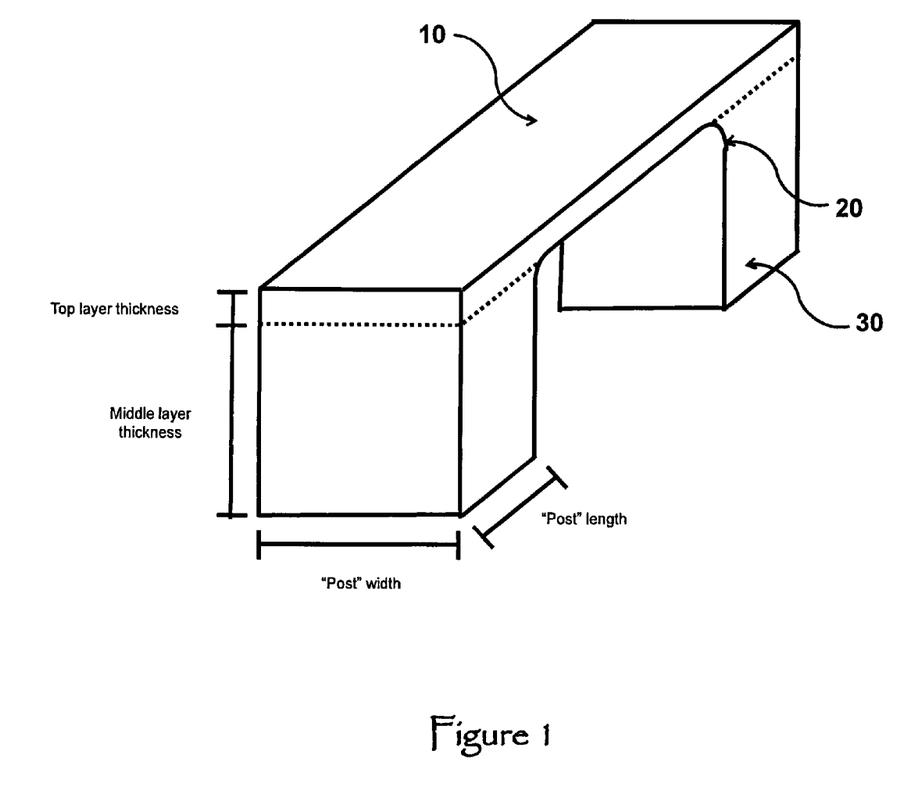
FIG. 1 depicts a single pixel, or pixel bridge structure, constructed from superconducting material such as NbN. The "road bed" of the bridge is the active detection area, the posts connect the active detection area elements to the lead layer by penetrating the middle layer. Approximate measurements are estimated form existing public literature. We note the post need not be superconducting as long as the pixel is still long enough to avoid the latching condition.

The present invention may embody a multi-layer device architecture that consists of three or more interconnected layers. These layers will be referred to as the top or detection layer, the middle or insulating layer and the bottom or lead layer. As the names suggest the architecture of the present invention is based on the desirable goal of separating the leads and detector elements onto different layers while maintaining the necessary electrical connections. It is then possible to pixelate the detector. What is meant is that the present invention is able to create a full two-dimensional array of short sections of nanowires. These are called pixels or "pixel bridges" because of their suggestive shape as shown in FIG. 1. Other designs for the pixel shape and arrangement are possible within the scope of the present invention.

The bottom layer of the present invention (see 200, FIG. 7) consists of the fundamental substrate chip on which the device will be fabricated. Onto this layer is patterned (see 150, FIG. 6) the desired layout of the non-superconducting non-photon-detecting leads (see 50, FIG. 2), such as copper.

Figure 7:
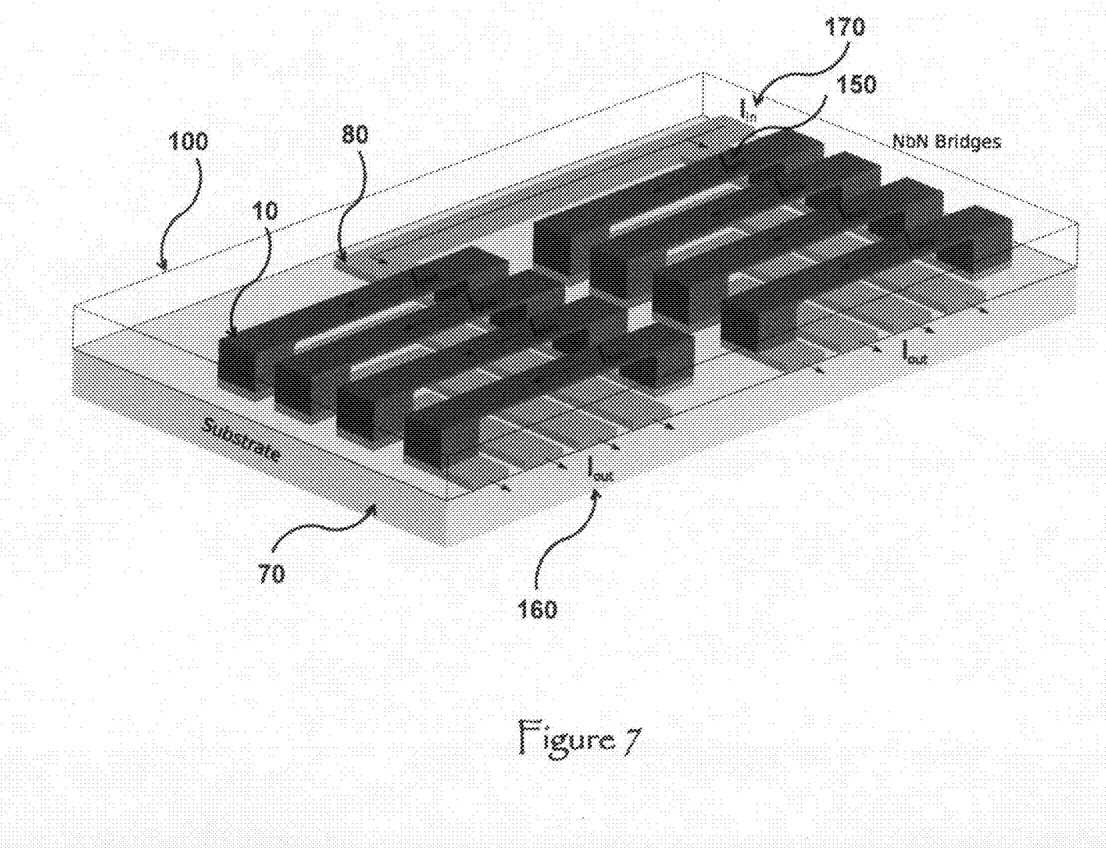
FIG. 7 depicts a three-dimensional view of a section of a similar MLSNPD, of the present invention. Note in this view that the posts in the middle layer are the same material, such as niobium nitride NbN, as the nanowire detector, forming the pixel "bridge". Arrows indicate the direction of the bias current.

Over this layer is placed an insulating layer (see 220, FIG. 7). This may be SiO, MgO, a high K-dielectric or any other of a number of materials that are transparent to the desired wavelength and which retain insulating properties at super cooled temperatures. The purpose of this layer is to insulate the superconducting nanowires from the leads that will pass beneath them. The minimum thickness of this layer will depend on the properties of the superconducting material, the insulating material, the lead material, the current and voltage applied to the device. The necessary effect is to prevent current leakage in either direction between the top and bottom layers. Contained within the middle layer are the posts of the superconducting "bridge" that create the electric connection between the top and bottom layer.

Figure 5:
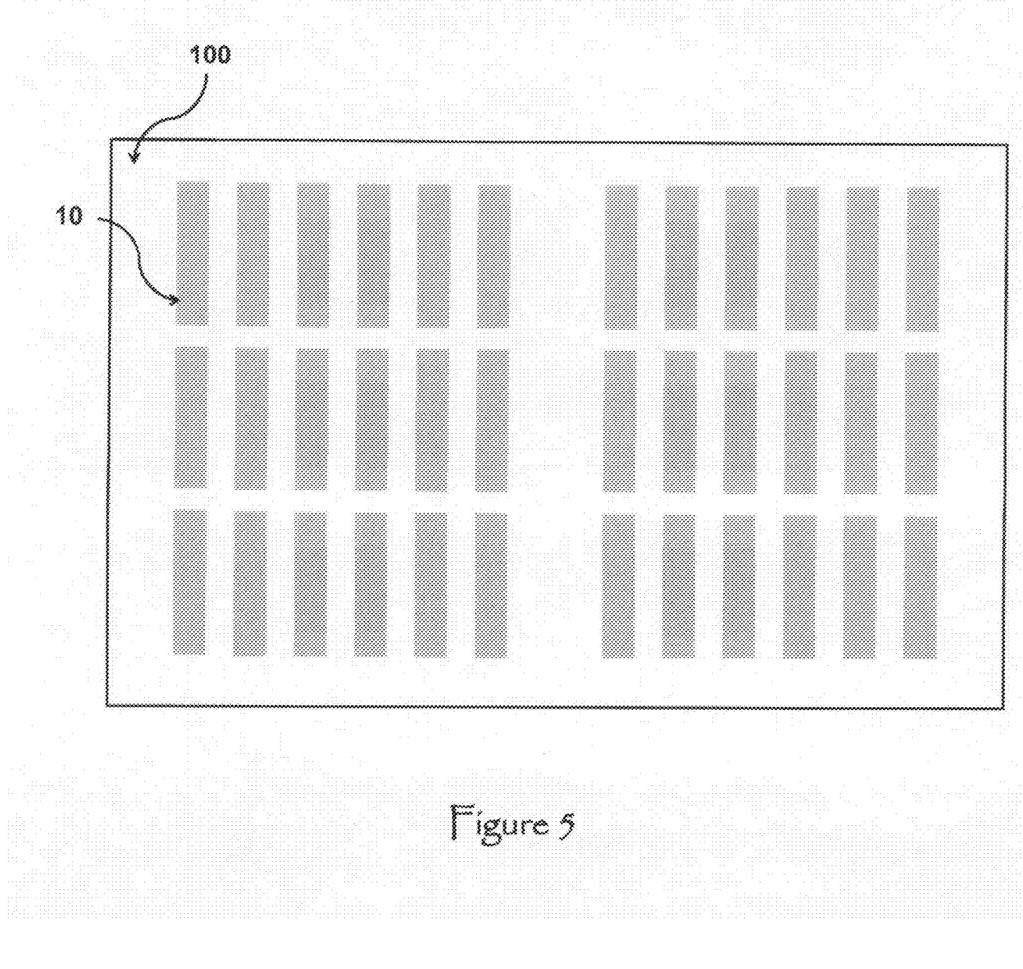
FIG. 5 depicts a top down schematic of an example of 36 superconducting nanowire pixels in the detection layer.

Set above this is the top or detection layer (see 200, FIG. 7). It consists of a thin layer of superconducting material that is then patterned into the desired pixel shape; this example is depicted in FIG. 5. This layer is approximately only 4-10 nanometers thick depending on the superconducting material used. This thickness is the same as that used in all detectors and will have identical properties.

The first and greatest advantage of the present invention's architecture is the highly efficient number resolving capability that is critical to many applications. The number resolving capability of a pixelated Multi-Layer Superconducting Nanowire Photon Detector (MLSNPD) can always be made larger than that of an equivalent MESNSPD that uses a single layer meander regardless of the number of nanowires it contains. This is accomplished by taking the meander pattern and separating each leg of the meander into its own pixel regardless of the initial pattern, the MESNSPD pattern need not be the standard square meander. The number resolving efficiency can be raised even higher by shorting and adding more pixels.

There is a minimum length that a superconducting nanowire can be used as a photon detector. This is due to the latching condition described by Kerman et al. (Applied Phys. Lett. 88,111116 (2008)). If the kinetic inductance of the nanowire becomes too small (equivalent to saying the wire is too short) then the nanowire will fail to return to the superconducting state after detecting a photon. This effect is created because the electric heating due to current passing through the hot spot is equal to or greater than the cooling being done to the system. This is an unsurpassable physical lower limit to single layer designs, but it is not so great a problem as the lower limit tends to be much smaller than the length of nanowire needed to create a useful meander area.

Small pixels, even pixels smaller than this latching limit can be created with our multi-layer design. It is noted that the length of the nanowire is not necessarily the same as the length of the active area of a pixel. FIG. 1 depicts a pixel bridge. The length of that nanowire, which determines the kinetic inductance, is the length of the active area on the detection level and the length of the two posts in the middle layer. Thus the pixel bridge of the present invention is larger than the pixel. While there is a minimum limit to the thickness of the insulating layer there is no maximum limit. Therefore, the nanowire used to make the pixel can be arbitrarily long without changing the pattern of the pixels on the detection layer. This allows a Multi-Layer Superconducting Nanowire Photon Detector (MLSNPD) to completely overcome this limit and to optimize the reset time during the device fabrication, where a single layer device cannot. Also in the current state of the art, designers seek to reduce the kinetic inductance of their device by choosing materials that have low kinetic inductance per unit length. A detector with small pixels may benefit from using a superconducting material with a higher kinetic inductance per unit length. This could reduce the need for extremely thick insulating layers. These features give MLSNPDs a clear advantage over all existing single layer devises, SNSPDs and MESNSPDs, in the crucial areas of number resolution and reset time.

By creating a regular pattern of a large number of pixels on the detection layer, the present invention gains significant, though not total, information about the spatial distribution of the incoming stream of photons. Initial devices may have too few elements, 10 to 20, to produce actual pictures. As fabrication methods improve reliability the number of elements can be increased significantly to the point of taking real images of nano scale phenomena by integrating over time or multiple repetitions of the events. This would effectively be a low light superconducting nanowire CCD camera. Such information could be used for low intensity applications of spectroscopy among others.

In the work by Kerman et al. constrictions are cited as a possible cause of reduced quantum efficiencies due to current crowding. The constrictions, such as bends in the nanowire, are the points closest to the critical temperature and are therefore the most sensitive to a photon impact. The majority of the SNSPDs and MESNSPDs are not constricted, straight sections of wire, and therefore have lower current densities and quantum efficiencies.

The single layer SNSPDs have a significant drawback that the constrictions increase as the fill factor of the meander pattern increases. These increased constrictions lead to increased current crowding at the bends and lower efficiency in the straight sections. This thwarts the purpose of increasing the fill factor, the desire for higher efficiency. As our MSLNPD pixels have no bends on the surface of the detection level they are not limited in this manner. Therefore our MLSNPDs can have higher fill factors. The only limit on the fill factor for our device is the unavoidable physical limit for avoiding cross talk and current leakage between pixels and is currently significantly higher than that achieved in effective SNSPDs. This effect is less significant in MESNSPDs but still plays a role.

Referring to FIG. 1, specifically the pixel bridge, it is clear that the area of greatest constriction and highest efficiency is the active detector layer 10 and there are no bends on the detector layer 10. The area of highest current crowding is right where it is wanted, in the active detector area 10. Therefore the present invention's pixel will average higher quantum efficiency than other similar detectors because current crowding is less of a problem, it is even an advantage.

DETAILED DESCRIPTION OF THE PREFERRED EMBODIMENT

Referring to FIG. 1, the fundamental detector element 10 is a bridge shaped construction of a superconducting nanowire. A plurality of detector elements 10 will form what is called the detection layer (as depicted FIG. 2). Vertical connections or "posts" 30 connect ends of the detector elements 10 to the lead layer via passage ways through the middle insulation layer. Detector elements 10 and vertical connections 30 form a "bridge" and define the bridge's length and height. The length of the bridge and the height of the bridge can be stretched arbitrarily. The thickness of the detector elements 10, or similarly, the thickness of the detection layer, is highly dependent on physical properties of the superconducting material used in the device.

The minimum length of the detector elements 10 and height of the vertical connections 30 of the "bridge" are determined by the same physical properties of the superconducting material as well at the properties of the insulting material, the desired size of the detection area and the overall layout of the pixel design. The interface of the top (detection) and middle (insulating) layers will depend on fabrication procedures and may affect the overall efficiency through "current crowding". FIG. 1 depicts an idealized curved interface 20 between the detector element 10 and the vertical connection 30 which serves the purpose of reducing the current crowding. Note that the scaling of this image will not be constant between all MLSNPDs based on the physical properties of the superconducting material used and the desired characteristics of the device. Therefore all subsequent figures are not to scale.

Figure 2:
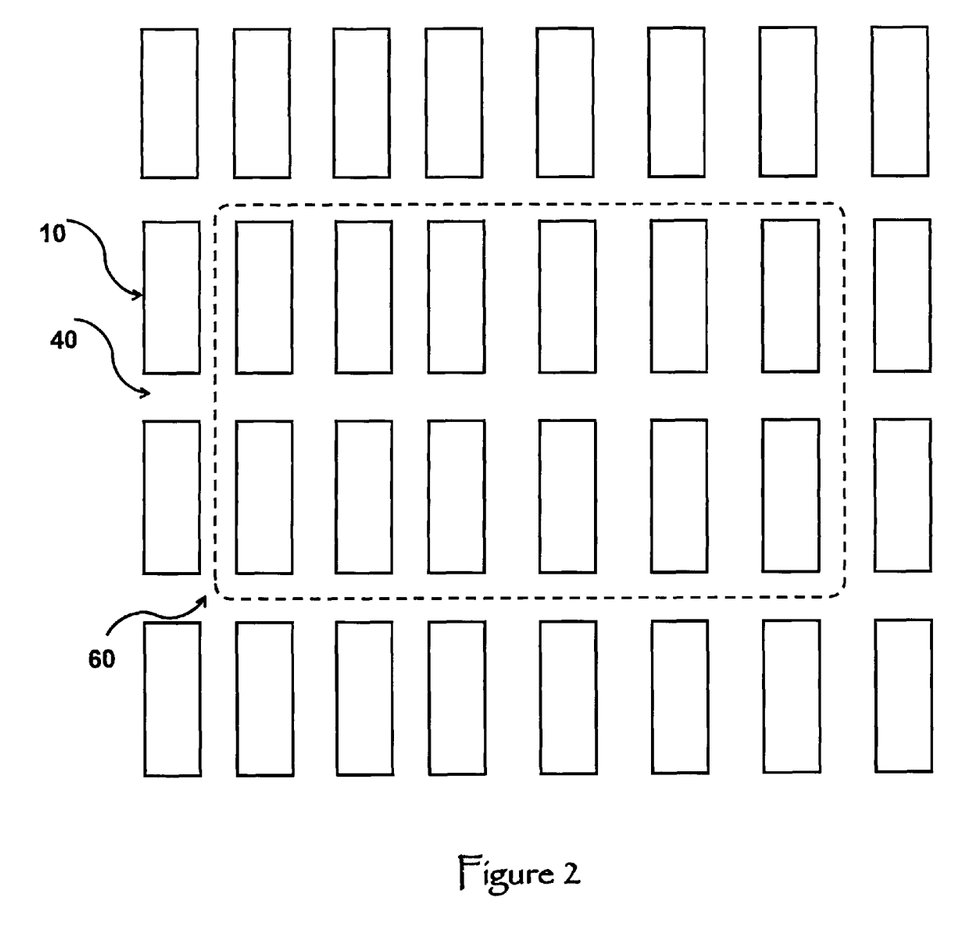
FIG. 2 depicts a top down schematic diagram representing a two-dimensional array of 32 pixels. Each rectangle is an independent superconducting nanowire detector element. The central pixels in the dashed box are those that a single layer architecture cannot connect leads to, while maintaining a useful fill factor.

Referring to FIG. 2, an idealized schematic plan view depiction of a two dimensional array of detector element pixels 10 on the detection layer. The dashed box 60 identifies the internal pixels which cannot be reached by leads without causing a loss in the fill factor, i.e. increasing non-detecting space between the pixels 40. This is due to the simple fact that the size of the leads is on the same order of magnitude as the pixels.

Figure 3:
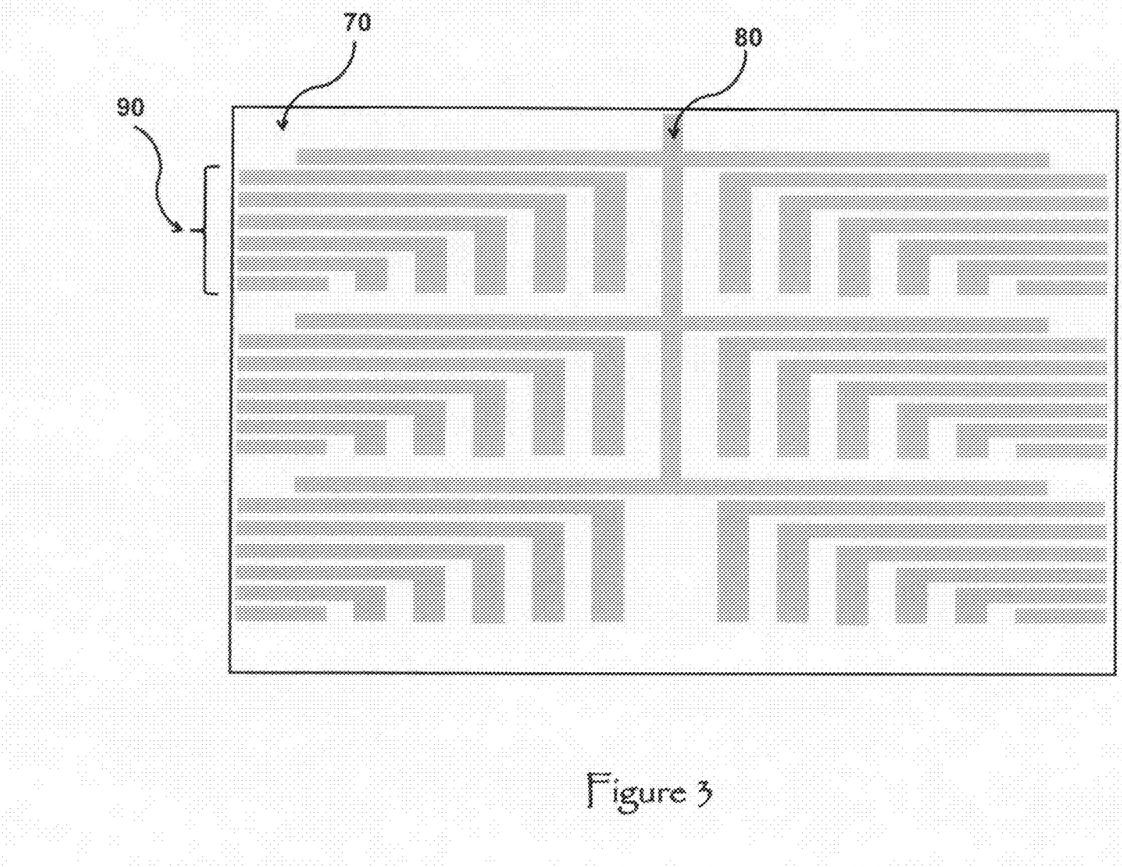
FIG. 3 depicts a top down schematic view of the bottom or lead layer showing one possible pattern of leads placed on a substrate having inputs and outputs. Note that there is no complete circuit shown on this level, this forces the current up into the higher layers.

FIG. 3 shows the bottom or lead layer of the invention. Input leads 80 and output leads 90 are fabricated onto a substrate layer 70. The choice of substrate will likely be determined by fabrication methods and the superconducting material used. As such, the choice of substrate material is not specified here and does not affect the scope of the invention. Input leads 80 and output leads 90 are patterned in conductive, but not superconducting material, such as copper. Note there is no electrical connection between the input leads 80 and output leads 90 on this layer. The input leads 80 and output leads 90 are shown in a parallel configuration. These leads may equivalently be separate circuits, series circuits, blocks of parallel and or series circuits, or other simple arrangements with correspondingly different detection electronics, without affecting the fundamental invention.

Figure 4:
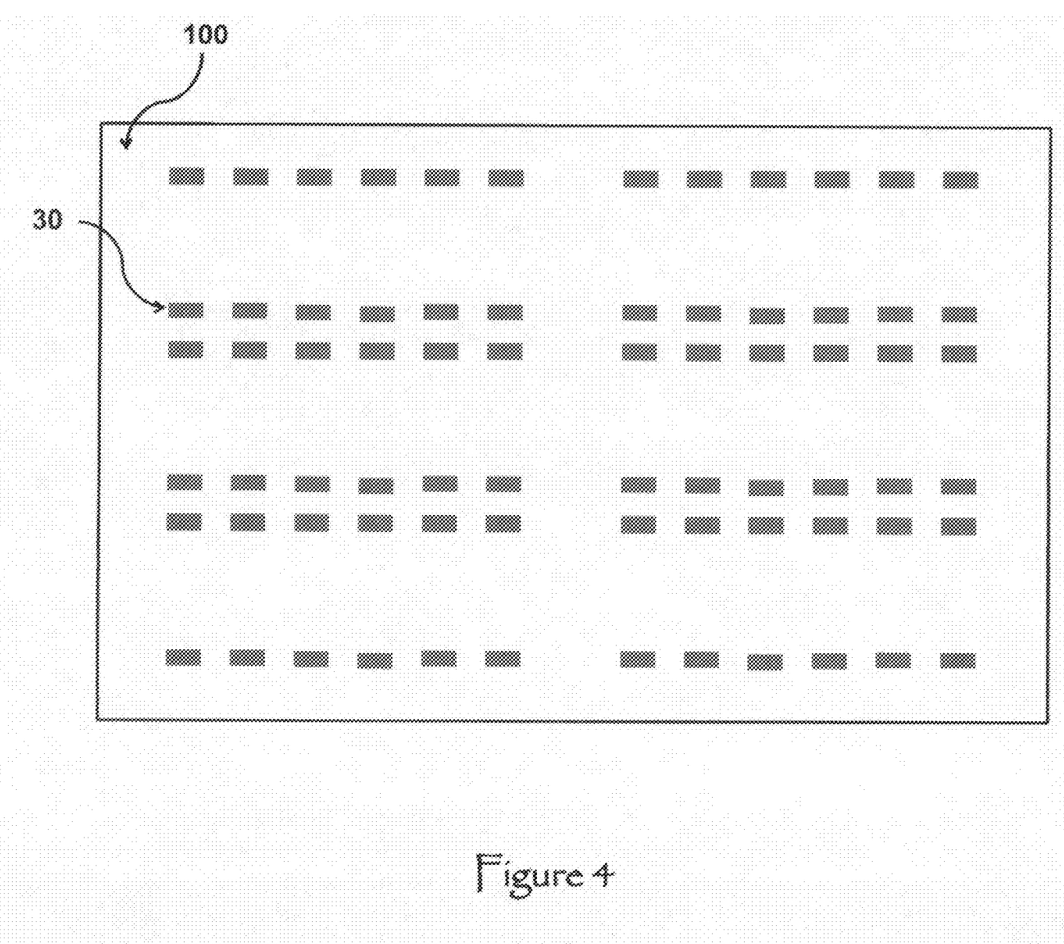
FIG. 4 depicts a top down view of the middle or insulating layer. The rectangular patches are the vertical conductive connections between the lead layer leads and the pixels in the detection layer.

Referring to FIG. 4, the middle or insulating layer 100 consists of an insulating material into which "vias", i.e. passage ways, provide for the vertical connection 30 posts to pass between the detector elements 10 and the leads 80, 90. These posts 30 fully penetrate the insulating layer material 100 and when properly patterned will connect the leads 80, 90 in the bottom layer substrate 70 and the detector element 10 nanowires, which collectively, comprise the top or detection layer. This configuration thus forms the desired plurality of pixel bridges of the detection layer. We note that for some configurations, particularly meander arrays and other long pixels shapes that the posts need not be superconducting material and may be the same or similar material as the leads, i.e. copper.

Referring to FIG. 5, the top or detection layer consists of a pattern of superconducting detector elements 10. These detector elements are placed such that they overlap the posts (see 30, FIG. 4) in the middle layer and thus complete the circuit through the device. The elements may or may not be embedded in a non-superconducting material, and may be patterned directly on the top surface of the middle insulating layer 100. Different fabrication procedures may necessitate an insulating embedding material but this does not alter the behavior of the device.

Figure 6:
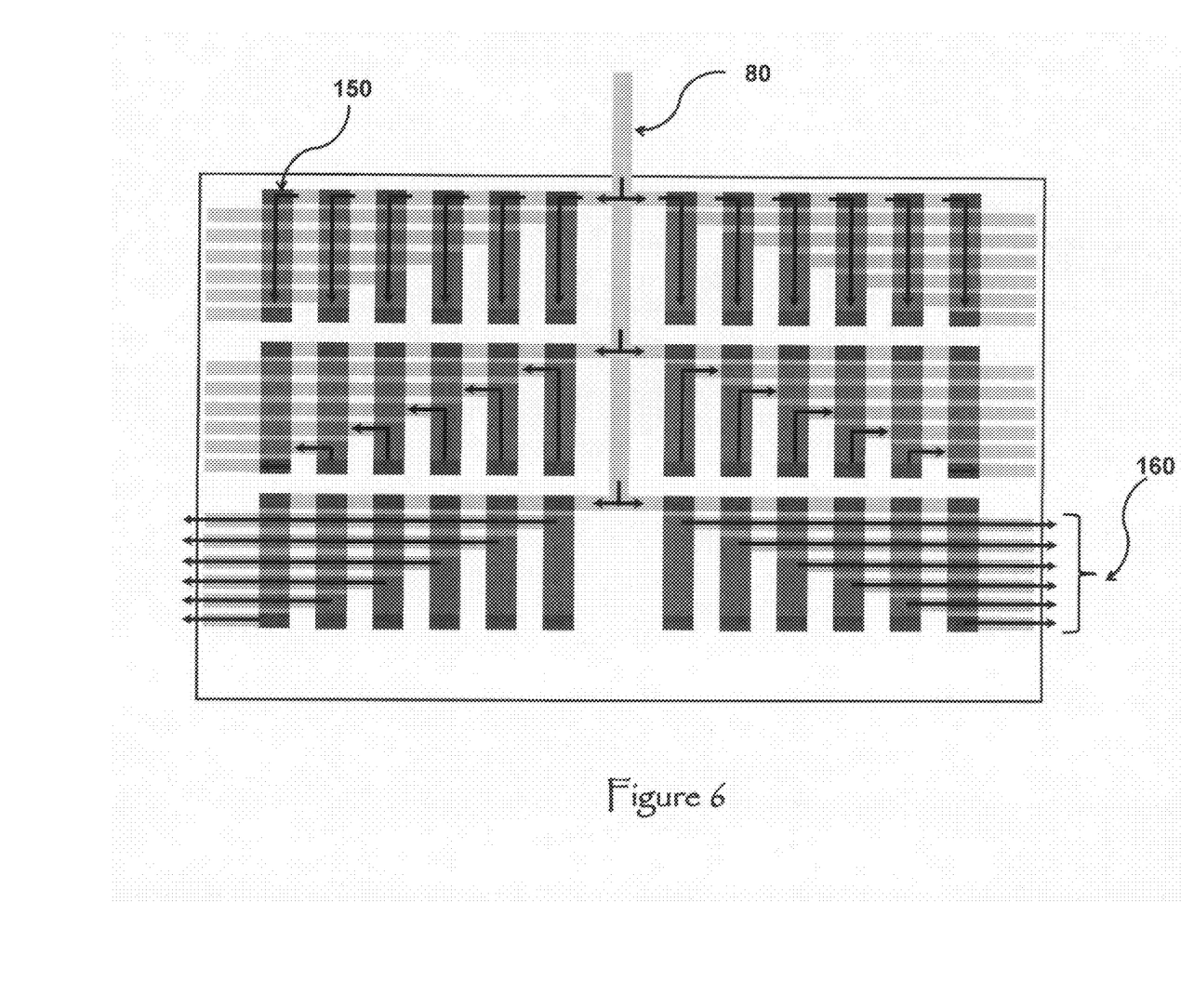
FIG. 6 depicts a composite of FIG. 2, FIG. 3 and FIG. 4 so as to show a top down schematic of the stacked detection layer, insulating layer, and lead layer of a Multi-Layer Superconducting Nanowire Photon Detector (MLSNPD).

In FIG. 6 the arrows indicate the direction of current flow though the device. The input current 150 enters in an input lead 80 the lead layer at the top center of this example and spreads to the parallel detector elements 10. The current rises through the insulating layer via the posts 30. The current then moves along the detector element 10 similarly to single layer designs, but then returns to the lead layer in order to exit the device at output leads 90 as output current depicted by arrows 160.

FIG. 7 shows these layers are aligned and stacked to form the MLSNPD. The current 170 enters the device at the input lead 80 or leads 80 in the bottom layer. The current then divides among the detector elements 10. The amount of current in each element can be controlled independently by altering the total resistance of that wire either during fabrication or with off chip resistors. The ideal form for most applications will have identical currents running though each detector element 10. The current 150 then rises to the detection layer via the "posts" (see 30, FIG. 4), through the insulating middle layer 100. These currents are called bias currents 150 and will create the heating that holds the device just below the critical temperature. After crossing the light sensitive area of the pixel 10 the current returns to the bottom layer and is channeled out to the counting electronics via the output leads 160. One skilled in the art would note that additional layers may be added without altering the basis of the invention. Such as, but not limited to, the inclusion of layers used to create an optical cavity around the active area of the detection layer.

Still referring to FIG. 7, the size of the pixel array has been reduced for clarity but all fundamental elements remain. The two-dimensional array of pixel bridges is show along with the leads that pass underneath them. This is a feature that single layer devices are physically incapable of recreating. This ability is what gives the MLSNPD its advantage in pixel number and pattern over the single layer meander devices currently used. Similar to above, the current enters in the bottom layer at 170. After dividing into bias currents $I_{bias}$ 150 it crosses the pixel bridges 10 and exits via the output leads 160. The device is created on substrate 70, with middle layer "posts" (see 30, FIG. 4) and an insulating layer 100.

Figure 8:
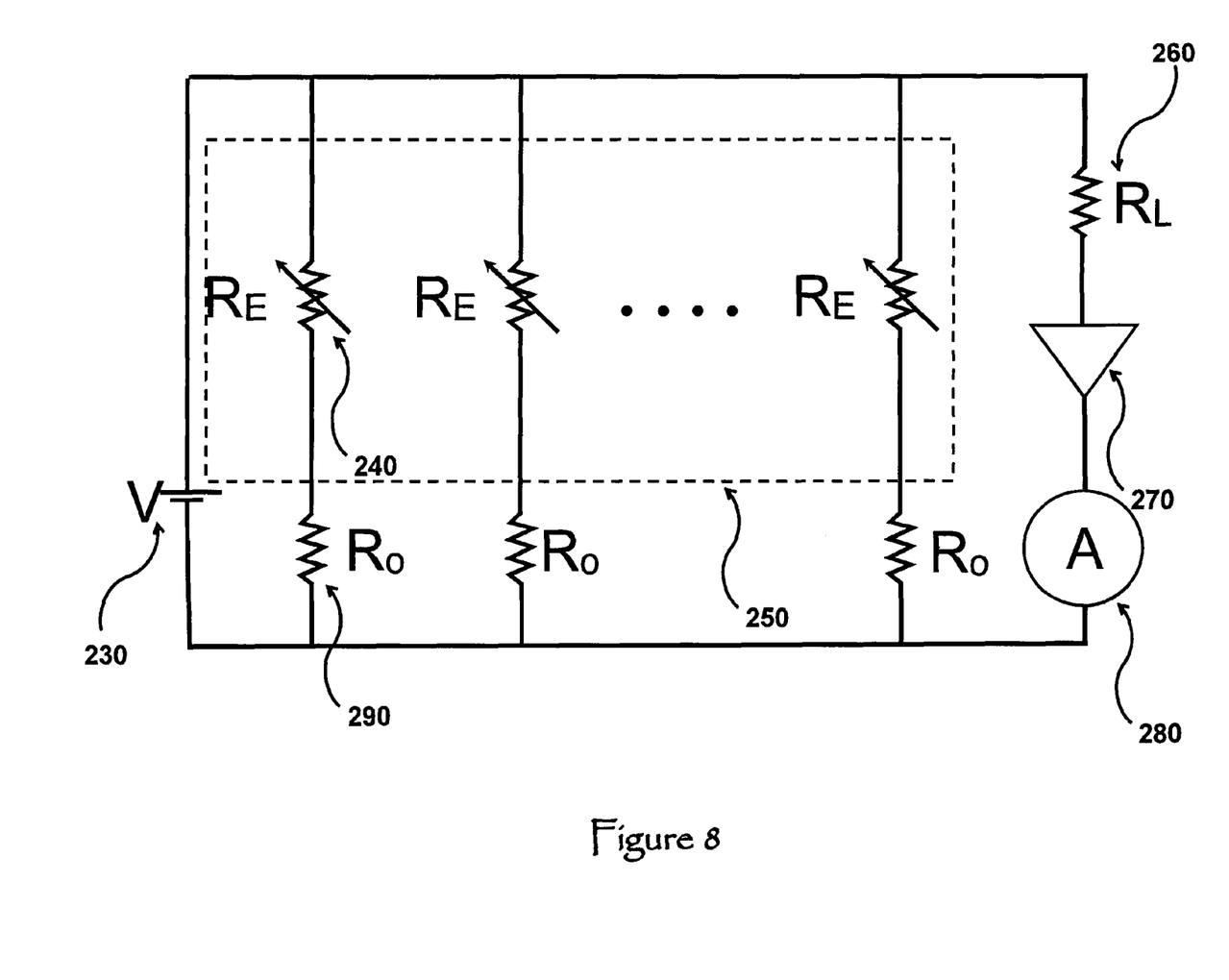
FIG. 8 depicts a circuit diagram of the detector and the off chip electric elements used for detecting the photon response.

FIG. 8 depicts an equivalent circuit diagram of the device including the off chip, i.e. not super cooled, electronics. The voltage source is any DC source 230, of either variable voltage or preselected to create the desired bias current for a given device. The superconducting nanowire detector elements (pixels) are indicated by variable resistors $R_E$ 240. When a photon impacts a pixel the resistance of that element rises significantly for a short time (it could also be considered a type of light dependent resistor). This diverts some fraction of the bias current from that element into the other possible paths. This includes both the other elements and the measuring path. The dashed box 250 indicates the minimum part of the circuit, containing the pixels that must be super cooled. The off-chip detection consists of a resistance load $R_L$ 260, and an ammeter, or similarly a galvanometer or oscilloscope 280 depending on the required sensitivity for a given device or application, and optionally, a signal amplifier 270.

The resistors $R_O$ 290 and $R_L$ 260 are chosen so as to maximize the fraction of the diverted current that enters the measurement apparatus, while maintaining a useful signal to noise ratio. $R_O$ 290 may or may not be on the super cooled chip. The ratios of the resistors $R_O$ 290, $R_L$ 260 and $R_E$ 240 will determine factors such as the signal to noise ratio and affect other characteristics such as the reset time. $R_O$ 290 and $R_L$ 260 can be controlled arbitrarily but $R_E$ 240 is the resistance of the hot spot and will be fixed by the superconducting nanowire material and the geometry of the nanowire. This leads to optimal values of $R_O$ 290 and $R_L$ 260 that differ for every pixel number and material. As a rule of thumb we state that for any system the resistance should behave roughly as $R_E \gg R_O \geq R_L$. We note here that the details of the off chip electronics are no different than that of existing SNSPDs and MESNSPDs and that the contact pads on the lead layer that allow for the connection of the off chip wires to the on chip leads are not shown as they are industry standards.

Having described the preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A superconducting nanowire photon detector apparatus, comprising;
   at least one substrate layer, said substrate layer comprising an interconnection means fabricated thereon;
   at least one insulating layer; and
   at least one detection layer, said detection layer comprising a plurality of super conducting detector elements being fabricated on said insulating layer, each of said detector elements having an input, an output, and a superconducting resistance characteristic;
   wherein said insulating layer is fabricated between said substrate and said detection layer so as to insulate said interconnection means from said detection layer;
   wherein said interconnection means further comprises means for:
      routing signals input into said apparatus to the inputs of each of said plurality of detector elements; and
      routing signals output from each of said plurality of detector elements out of said apparatus; and
   wherein said insulating layer further comprises means for each of said inputs and outputs of each of said detector elements to make electrical contact with corresponding portions of said interconnection means.

2. Apparatus of claim 1 wherein said means for each of said inputs and outputs of each of said detector elements to make electrical contact further comprises:
   voids in said insulating layer coincident with the location of each of said inputs and outputs of each of said plurality of detector elements;
   wherein said voids penetrate the thickness of said insulating layer; and
   posts composed of superconducting material disposed therethrough each of said voids so as to electrically connect said inputs and said outputs of each of said detector elements to corresponding portions of said interconnection means.

3. Apparatus of claim 1 wherein said means for routing signals comprises meandering conductors.

4. Apparatus of claim 3 wherein said each of detector elements, and each of said posts connected to said input and said output of said detector elements, form a bridge structure under which conductors not intended to be electrically connected to, pass.

5. Apparatus of claim 4 wherein an interface formed at the connection of each said input and said output of said detector elements and said posts is radiused so as to prevent current crowding.

6. Apparatus of claim 4 wherein said means for routing signals supports the flow of a bias current into said apparatus, through each said bridge structure, and out of said apparatus.

7. The apparatus of claim 6, wherein said bias current creates heating in said detector element to just below said detector's critical temperature.

8. The apparatus of claim 7, wherein photon impacts upon said detector element cause:
   a rise in the resistance of said detector element; and
   a diversion of said bias current from said detector element to other current paths among said meandering conductors.

9. The apparatus of claim 8, wherein said interconnection means routes said diverted bias currents out of said apparatus into a measurement means comprising a load resistance and a measurement device.

10. The apparatus of claim 1 wherein said insulating layer is comprised of materials which retain insulating properties at super-cooled temperatures; and
    are transparent to a desired wavelength.

11. The apparatus of claim 1 wherein the thickness of said detection layer is in the range of approximately 4 to 10 nanometers.

12. The apparatus of claim 9 wherein said measurement means further comprises an amplifier.

13. The apparatus of claim 12 wherein the resistance of said detector element, bias resistance and said load resistance are chosen such that:

$$R_E \gg R_O \geq R_L$$

where $R_E$ is a resistance of the detector element at a given temperature;
$R_O$ is a bias resistance; and
$R_L$ is a load resistance.

* * * * *